United States Patent

Karamchedu

(10) Patent No.: US 9,912,283 B2
(45) Date of Patent: Mar. 6, 2018

(54) SOLAR ENERGY APPARATUS AND METHOD

(71) Applicant: Chaitanya Karamchedu, Portland, OR (US)

(72) Inventor: Chaitanya Karamchedu, Portland, OR (US)

(*) Notice: Subject to any disclaimer, the term of this patent is extended or adjusted under 35 U.S.C. 154(b) by 28 days.

(21) Appl. No.: 14/260,028

(22) Filed: Apr. 23, 2014

(65) Prior Publication Data

US 2015/0311367 A1    Oct. 29, 2015

(51) Int. Cl.
*H01L 31/043* (2014.01)
*H02S 20/10* (2014.01)
*H01L 25/04* (2014.01)

(52) U.S. Cl.
CPC ............ *H02S 20/10* (2014.12); *H01L 25/043* (2013.01); *H01L 2924/0002* (2013.01)

(58) Field of Classification Search
CPC ....... H01L 31/043; H01L 31/02; H01L 31/00; H01L 31/042; H01L 31/0232; H01L 31/02327; H01L 25/043; F24J 2002/0038; F24J 2002/0046; F24J 2002/0053; F24J 2002/0061; F24J 2002/0069; F24J 2002/0076; F24J 2002/0084; F24J 2002/0433; F24J 2002/0444; F24J 2/0444; H02S 20/10
USPC ....................................... 136/244
See application file for complete search history.

(56) References Cited

U.S. PATENT DOCUMENTS

| | | | | |
|---|---|---|---|---|
| 6,515,217 B1* | 2/2003 | Aylaian | .................. | H01L 31/048 136/244 |
| 2009/0025779 A1* | 1/2009 | Hsiao | .................... | H01L 31/043 136/246 |

OTHER PUBLICATIONS

Varadan et al. Eco green flexible hybrid photovoltaic-thermoelectric solar cells with nanoimprint technology and roll-to-roll manufacturing. Nanosensors, Biosensors, and Info-Tech Sensors and Systems 2010, edited by Vijay K. Varadan, Proc. of SPIE vol. 7646, 764605.*

Mejdoubi et al. Dielectric response of perforated two-dimensional lossy heterstructures: A finite approach. Journal of Applied Physics 2006, vol. 100, 094103.*

Volpe et al. Fractal plasmonics: subdiffraction focusing and broadband spectral response by a Sierpinski nanocarpet. Optics Express 2011, vol. 19, No. 4, p. 3612-3618.*

* cited by examiner

*Primary Examiner* — Matthew T Martin
*Assistant Examiner* — Dujuan A Horton
(74) *Attorney, Agent, or Firm* — Schwabe, Williamson & Wyatt, P.C.

(57) ABSTRACT

Disclosed embodiments include multi-plane photovoltaic modules and/or solar panel arrangements, as well as solar farms constituted with such arrangements/modules. In embodiments, a solar panel arrangement may include a first solar panel having a first plurality of solar photovoltaic modules, disposed at a first plane; and a second solar panel having a second plurality of solar photovoltaic modules, disposed at a second plane; vertically offset from the first plane. Similarly, in embodiments, a photovoltaic module may include a first substrate having a first plurality of photovoltaic cells, disposed at a first plane; and a second substrate having a second plurality of photovoltaic cells, disposed at a second plane, vertically offset from the first plane. Other embodiments may be described and claimed.

7 Claims, 4 Drawing Sheets

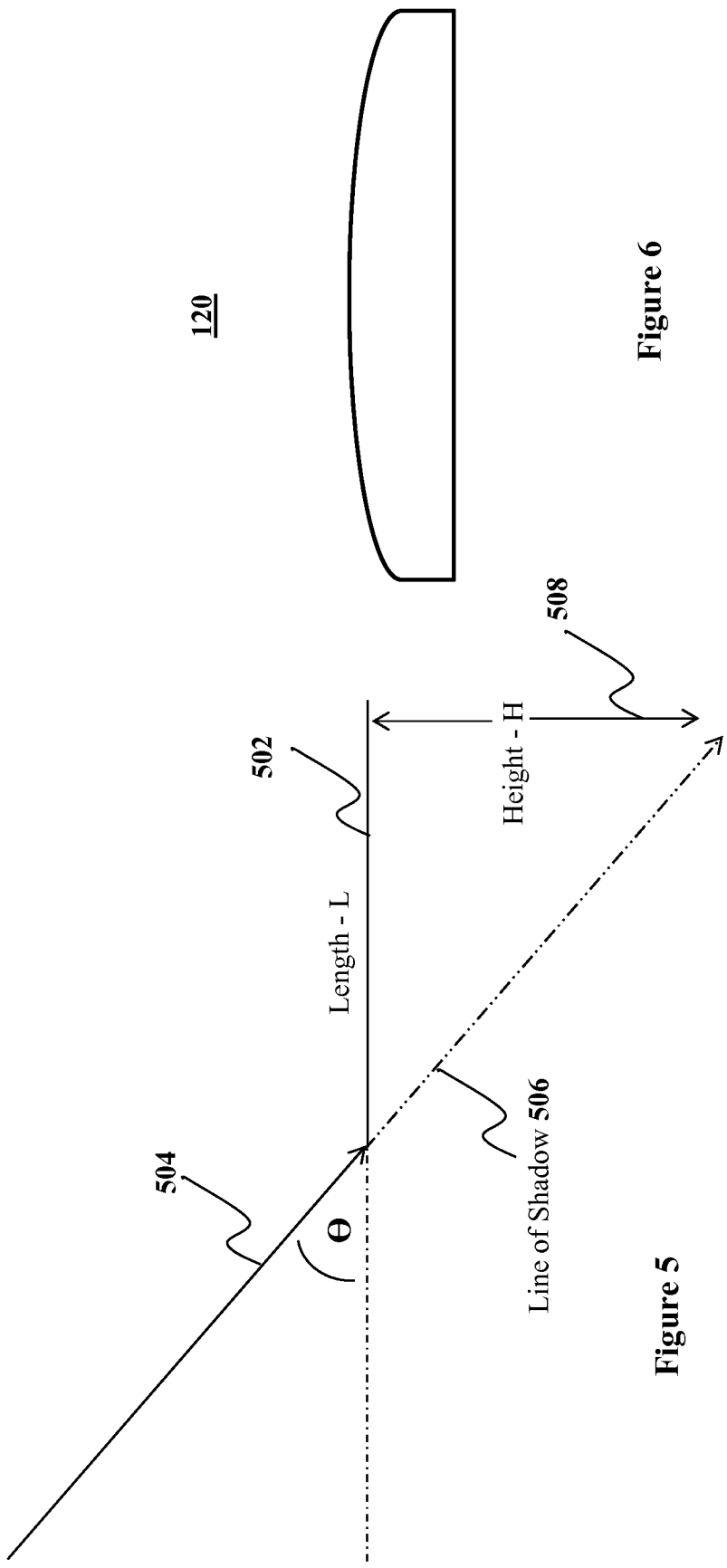

SOLAR ENERGY APPARATUS AND METHOD

TECHNICAL FIELD

The present disclosure relates to the field of solar energy. More particularly, the present disclosure relates to multi-level photovoltaic modules and solar panels.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

With increased concerns for global warming, and sustainability of fossil fuels, there has been increased interest in renewable energy, including solar energy. Today, a solar panel typically includes one plane of photovoltaic modules. A solar farm would typically include hundreds or thousands of single plane solar planes spanning a large area. Recently, there has been development of photovoltaic modules that include three dimensional photovoltaic cells, in the form of towers. Photons would be trapped and allowed to be bounced around within a photovoltaic module, resulting in increase in photon absorption by the photovoltaic cell towers, and energy generation.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 5 illustrates the relationship between the vertical distance separating the panels/layers, the angle of incidence of light, and the length of a solar panel/layer (segment), according to various embodiments.

FIG. 6 illustrates a side view of the cover of FIG. 1, according to various embodiments.

DETAILED DESCRIPTION

Figure 1:
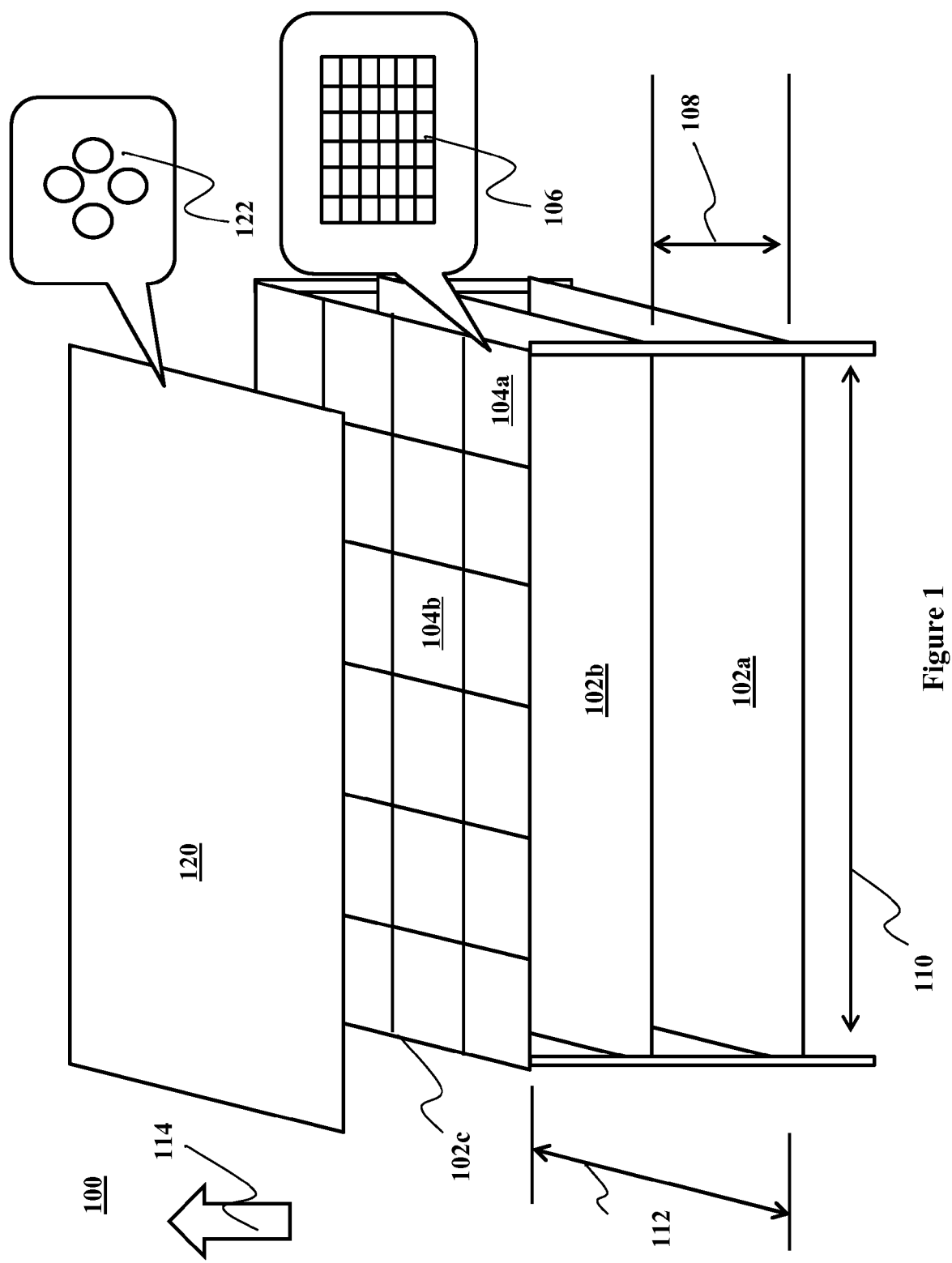
FIG. 1 illustrates a perspective view of a multi-level solar panel arrangement, according to the various embodiments.

Disclosed embodiments include multi-level photovoltaic modules and/or solar panel arrangements, as well as solar farm constituted with such arrangements/modules. In embodiments, a solar panel arrangement may include a first solar panel having a first plurality of solar photovoltaic modules, disposed at a first plane; and a second solar panel having a second plurality of solar photovoltaic modules, disposed at a second plane, vertically offset from the first plane. Similarly, in embodiments, a photovoltaic module may include a first substrate having a first plurality of photovoltaic cells, disposed at a first plane; and a second substrate having a second plurality of photovoltaic cells, disposed at a second plane, vertically offset from the first plane.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Referring now to FIG. 1, wherein a perspective view of a multi-level solar panel arrangement according to various embodiments, is shown. As illustrated, arrangement 100 may include a number of solar panels, 102a, 102b, and 102c. Each of the solar panels 102a-102c may include a number of photovoltaic modules, each having a number of photovoltaic cells 106. Further, each pair of the vertically adjacent solar panels 102a-102b, or 102b-102c may be vertically offset from each other by a distance or height (H) 108. H 108 may vary between different pairs of vertically adjacent solar panels (to be described in more detail below.) The vertical direction is depicted in FIG. 1 by arrow 114, with arrow 114 pointing to the upward direction.

In embodiments, H 108 for a pair of vertically adjacent solar panels may be selected based at least in part on the angle θ of incidence of light during the expected operational period, e.g., for some terrestrial areas, between 10 o'clock and 2 o'clock, and the length L 110 of the upper solar panel of the pair to reduce the shadow casted by the upper solar panel of the pair onto the lower solar panel of the pair. As illustrated in FIG. 5, if the angle of incidence of light 504 is θ, the shadow cast by the upper solar panel 502 of a pair with length L 502 may be illustrated by the line of shadow 506. Thus, the desired inter panel distance H 508 may be determined in accordance with the following equation:

$$H = L*\mathrm{Tan}(\theta) \qquad (1)$$

where Tan is the trigonometry function—tangent.

In other words, for terrestrial areas with θ equals 65 degrees, the vertical offset H 108 or 508 between a pair of vertically adjacent panels 102a-102b or 102b-102c may be set to 1.73 of the length L of the upper solar panel 102b or 102c of the pair.

Before further describing multi-level solar panel arrangement 100, it should also be noted, while for ease of understanding, multi-level solar panel arrangement 100 is being described with three solar panels 102a-102c. The description is not to be construed as limiting. The present disclosure may be practiced with less solar panels, e.g., two, or more than three solar panels.

Continuing to refer to FIG. 1, in embodiments, to further enhance the efficiency of multi-level solar panel arrangement 100, a fractal pattern may be iteratively applied to the successive higher solar panels to allow more light to reach the lower solar panels. The application of fractal pattern, including the implication on the selection of inter-panel distance or height will now be described. In these embodiments, except for the bottom solar panel 102a, each of intermediate solar panel 102b and top solar panel 102c may include two types of areas 104a and 104b. Each of areas 104a may include one or more photovoltaic modules having one or more photovoltaic cells 106. Whereas, each of areas 104b may include a number of photonic openings, to allow light to travel through to the lower panels. In embodiments, a photonic opening may be a physical opening, while in other embodiments, a photonic opening may be an effective opening constituted with materials that allow lights to travel through, e.g., glass.

Figure 2:
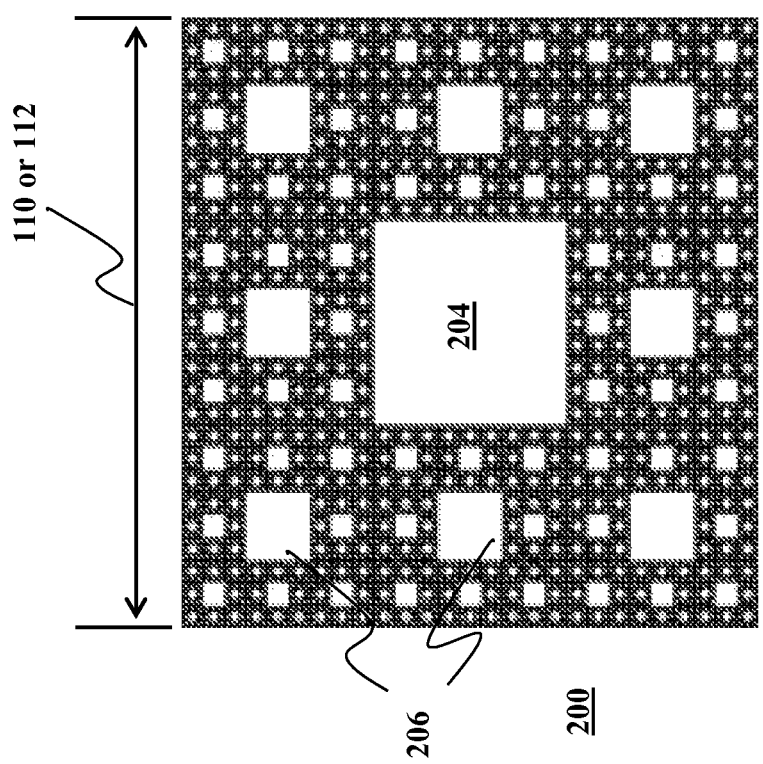
FIG. 2 illustrates an example fractal pattern, suitable for use for the present disclosure, according to the various embodiments.

In embodiments, the photovoltaic modules, together with the photonic openings separating them, may be arranged in one or more fractal patterns. In embodiments, the photovoltaic modules, together with the photonic openings separating them, of a solar panel 102c with length (L) 110 and width (L) 112, may be arranged in a Sierprinski Carpet fractal pattern. Referring now also to FIG. 2, wherein a Sierprinski Carpet fractal pattern is shown. The Sierprinski Carpet fractal pattern may be formed on a square area 200 with a process first dividing the square area into nine areas, and having the center area 204 removed, hollowed or otherwise made transparent to allow light to pass through, to use as a photonic opening. The process may then be repeated in each of the remaining eight areas, resulting in the center areas 206 of the remaining areas being removed, hollowed or otherwise made transparent. The process may continue for any number of nested levels as desired or practical.

The fractal dimension (D) of a fractal pattern is given by the formula:

$$D = \mathrm{Log}(\mathrm{Obj})/\mathrm{Log}(m) \qquad (2)$$

where Obj is the number of repeating objects, and m is magnification.

Figure 3:
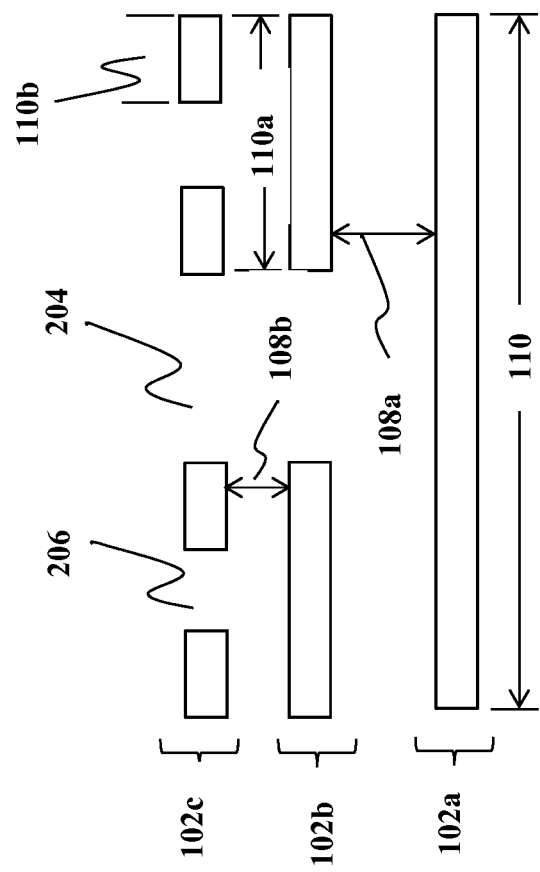
FIG. 3 illustrates a cross sectional view of the solar panel arrangement of FIG. 1, according to various embodiments.

FIG. 3 illustrates a cross-sectional view of multi-level solar panel arrangement 100 where the photovoltaic modules and the photonic openings of the successive higher solar panels 102b-102c are arranged in accordance with a Sierprinski Carpet fractal pattern. The vertical offset 108a or 108b between each pair of vertically adjacent solar panels 102a-102b or 102b-102c may still be selected using equation (1), however, L in equation (1) is set to the length of the un-hollowed or non-transparent segment 110a or 110b of the upper solar panel of a pair.

For embodiments with the Sierprinski Carpet fractal pattern applied to arrange the photovoltaic modules and the photonic openings of the successive higher solar panels 102b-102c, L 110a is about ⅓ of L 110, and L 110b is about ⅓ of L 110a. Thus, for embodiments, with fractal pattern applied to arrange the photovoltaic modules and the photonic openings of the successive higher solar panels 102b-102c, L(i) may be referred to as the "effective" segment length of the ith layer, and may be given by the following formula:

$$L(i) = K*L(i-1)$$

where K a constant reduction factor for a specific fractal pattern, and

L(i) and L(i−1) are the effective segment length of the ith and ith−1 layer, with L(0), the lowest layer having length L.

In embodiments, a Sierprinski Carpet fractal pattern with a fractal dimension of 1.87, which approximates the fractal dimension of a number of low light surviving plants, is used. In other embodiments, other fractal patterns, in particular, those with a fractal dimension in the range of 1.6-1.8 may be used.

During experiment, it was observed that power output by multi-level solar panel arrangement 100 may be characterized in terms of the number fractal layers included, as follows:

$$P(N) = 1.36 P(N-1) \qquad (3)$$

where P(N) is the total power generated after including N fractal layers into solar panel arrangement 100, and P(N−1) is the total power generated after including N−1 fractal layers into solar panel arrangement 100.

Accordingly, the power yield per unit area occupied by a multi-level solar panel arrangement 100 may be more efficient than a similarly sized single plane solar panel. In other words, multi-level solar panel arrangements 100 may require less surface area to produce Q units of electricity than prior art single level solar panels. Thus, a solar farm having a large collection of multi-level solar panel arrangements 100 may provide substantial savings in surface areas to produce Q units of electricity than prior art single plane solar panels. Note that multi-level solar panel arrangement 100 may also be referred to as multi-plane solar panel arrangement 100. The two terms may be used interchangeably.

Still referring to FIG. 1, in alternate embodiments where width 112 is one-half of length (L) 110, the photovoltaic modules and the photonic openings of successive higher solar panels may be arranged with two Sierprinski Carpet fractal patterns of width L/2. In still other embodiments, where the ratio of length (L) 110 to width 112 is of other multiples, other fractal patterns may be employed to systematically allow more light to reach the lower solar panels.

in embodiments, multi-level solar arrangement 100 may further include a cover 120 covering at least the top solar panel 102c to provide protection from the environment, such as wind, or rain. In embodiments, cover 120 may be constituted with transparent material that allows light to pass through, such as transparent plastics. In embodiments, cover 120 may be dome shaped, as illustrated in FIG. 6, which shows a side view of cover 120. Further, the surface of cover 120 may be provided with a number of dimples 122 to facilitate focusing of the light passing through cover 120. In embodiments, dimples 122 may be arranged in one or more fractal patterns. In embodiments, the one or more fractal patterns may likewise be one or more Sierprinski Carpet fractal patterns as shown in FIG. 2.

Figure 4:
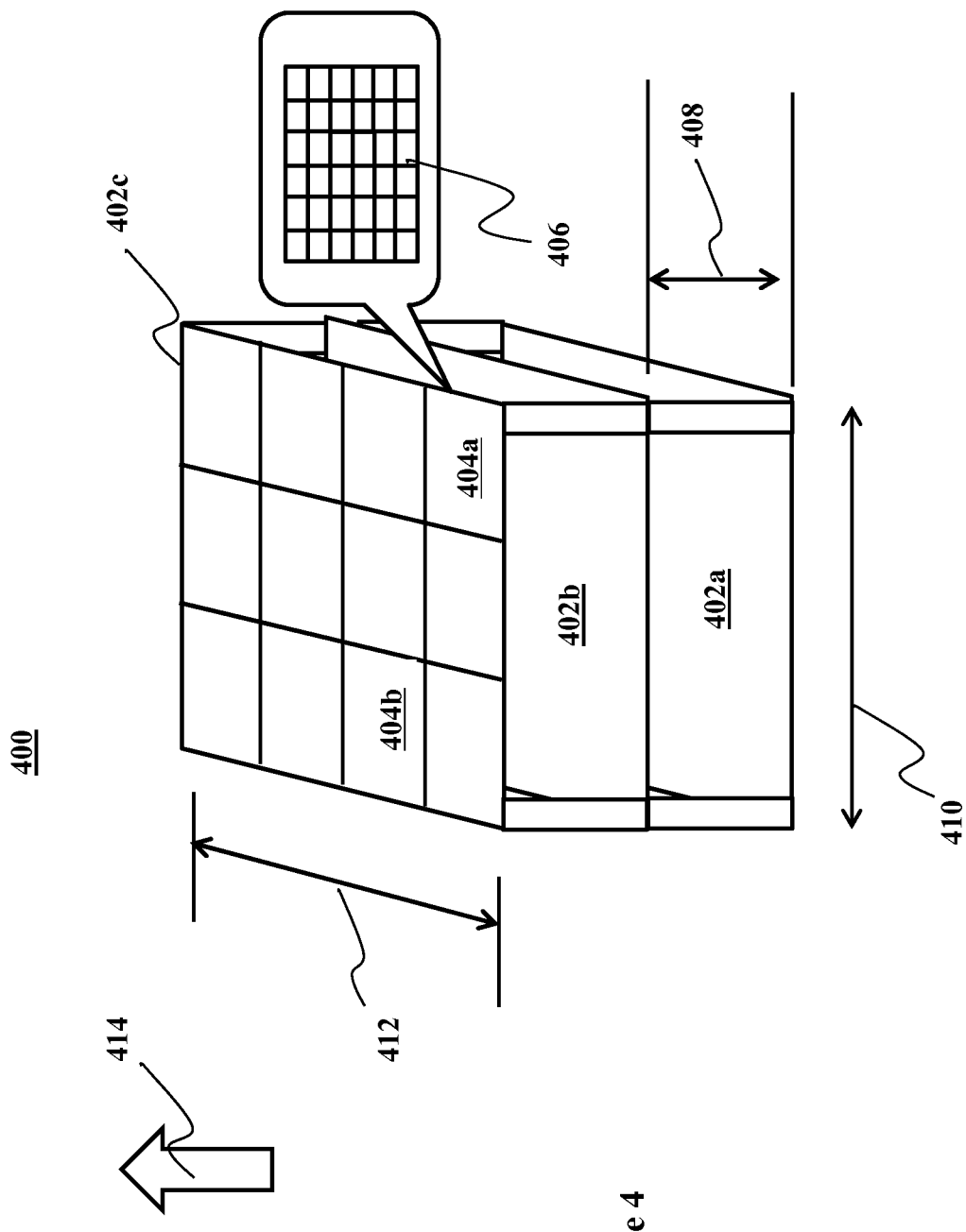
FIG. 4 illustrates a perspective view of a multi-level photovoltaic module, according to the various embodiments.

Referring now to FIG. 4, wherein a multi-level photovoltaic module according to various embodiments, is shown. As illustrated, multi-level photovoltaic module 400 may include a number of substrates, 402a, 402b, and 402c. Each of the substrates 402a-402c may include of number of photovoltaic cells 406. Further, each of the substrates 402a-402c may be vertically offset from each other by a distance or height (h) 408. The vertical direction is depicted in FIG. 4 by arrow 414, with arrow 414 pointing to the upward direction.

In embodiments, h 408 for a pair of vertically adjacent layers may be similarly determined based at least in part on the angle θ of incidence of light during the expected operational period, e.g., for some terrestrial areas, between 10 o'clock and 2 o'clock, and the length l 410 of the upper layer of the pair to reduce the shadow casted by the upper layer of the pair onto the lower layer of the pair. Thus, for a multi-level photovoltaic module 400 with photovoltaic cells having length l 410, h 408 may be determined in accordance with the following equation:

$$h = l * \text{Tan}(\theta) \quad (4)$$

where Tan is the trigonometry function—tangent.

In other words, when designing for terrestrial areas with θ equals 65 degrees, the vertical offset h may be set to 1.73 of the length l of the substrates 402a-402c.

Before further describing photovoltaic module 400, it should be noted, while for ease of understanding, photovoltaic module 400 is being described with three substrates 402a-402c, the present disclosure may be practiced with less substrates, e.g., two, or more than three substrates.

Continuing to refer to FIG. 4, in embodiments, to further enhance the efficiency of multi-level photovoltaic module 400, a fractal pattern may be iteratively applied to the successive higher layers to allow more light to reach the lower layers, as earlier described for multi-level solar panel arrangement 100. In other words, for these embodiments, except for the bottom substrate 402a, each of intermediate substrate 402b and top substrate 402c may include two types of areas 404a and 404b. Each of areas 404a may include one or more photovoltaic cells 406. Whereas, each of areas 404b may include a number of photonic openings, to allow light to travel through to the lower panels. In embodiments, a photonic opening may be a physical opening (such as vias), while in other embodiments, a photonic opening may be an effective opening constituted with materials that allow lights to travel through, e.g., glass.

In embodiments, photovoltaic cells 406, together with the photonic openings separating them, may be arranged in one or more fractal patterns. In embodiments, the photovoltaic cells 406, together with the photonic openings separating them, of a substrate 402c with length (l) 110 and width (l) 112, may be similarly arranged in a Sierprinski Carpet fractal pattern of width (l) 202.

For these embodiments, the inter-layer offsets between each pair of vertically adjacent layers may be likewise selected using equation (4), with l in equation (4) being set to the effective length segment of the upper layer of a vertically adjacent pair, as earlier described for multi-level solar panel arrangement 100.

In embodiments, a Sierprinski Carpet fractal pattern with a fractal dimension of 1.87, which approximates the fractal dimension of a number of low light surviving plants, is used. In other embodiments, other fractal patterns, in particular, those with a fractal dimension in the range of 1.6-1.8 may be used.

Accordingly, the power yield per unit area occupied by a multi-level photovoltaic module 400 may be more efficient than a similarly sized single substrate photovoltaic module. In other words, multi-level photovoltaic module 400 may require less surface area to produce q units of electricity than prior are single substrate photovoltaic module. Note that multi-level photovoltaic module 400 may also be referred to as multi-plane photovoltaic module 400 or multi-substrate photovoltaic module 400. These terms may be used interchangeably.

Further, similar to multi-level solar panel arrangement 100, in alternate embodiments where width 412 is one-half of length (L) 410, the photovoltaic modules and the photonic openings of successive higher substrates may be arranged with two Sierprinski Carpet fractal patterns of width L/2. In still other embodiments, where the ratio of length (L) 410 to width 412 is of other multiples, other fractal patterns may be employed to systematically allow more light to reach the lower substrates.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A multi-level arrangement of solar panels, comprising:
a plurality of solar panels, including:
a first solar panel having a first plurality of solar photovoltaic modules and a plurality of photonic openings disposed at a first plane, the plurality of photonic openings interspersed among the first plurality of solar photovoltaic modules; and
a second solar panel having a second plurality of solar photovoltaic modules, disposed at a second plane, vertically below the first plane; and
a cover covering the first solar panel;
wherein at least one of the solar photovoltaic modules of at least one of the first or second solar panel is a multi-level solar photovoltaic module that comprises:
a first substrate having a first plurality of photovoltaic cells and a plurality of vias disposed at a third plane, the plurality of vias interspersed among the first plurality of photovoltaic cells; and
a second substrate having a second plurality of photovoltaic cells, disposed at a fourth plane, vertically below the third plane.

2. The multi-level arrangement of solar panels of claim 1, wherein the plurality of vias of the first substrate of the at least one solar photovoltaic module are arranged in one or more fractal patterns.

3. The multi-level arrangement of solar panels of claim 2, wherein at least one of the one or more fractal patterns has a fractal dimension of about 1.6-1.8.

4. The multi-level arrangement of solar panels of claim 2, wherein at least one of the one or more fractal patterns comprises a Sierpinski Carpet fractal pattern.

5. The multi-level arrangement of solar panels of claim 2, wherein a vertical offset between the third and fourth planes of the at least one multi-level solar photovoltaic module is selected based at least in part on effective segment length of the first substrate.

6. The multi-level arrangement of solar panels of claim 1, wherein a vertical offset between the third and fourth planes of the at least one multi-level solar photovoltaic module is selected based at least in part on an angle of incidence of light on the solar photovoltaic cell(s) during an expected operating period.

7. The multi-level arrangement of solar panels of claim 1, wherein a vertical offset between the third and fourth planes of the at least one multi-level solar photovoltaic module is selected based at least in part on a length of the first and second substrates, wherein the first and second substrates of the at least one multi-level solar photovoltaic module have substantially the same length.

* * * * *